United States Patent [19]

Terral et al.

[11] 3,940,970
[45] Mar. 2, 1976

[54] EYELETTING ATTACHMENT FOR DRILL PRESSES

[75] Inventors: Leonard G. Terral, Ridgecrest, Calif.; Ephraim Regelson, Kensington, Md.; William E. Sake, Ridgecrest, Calif.; Ronald J. Matusiak, El Cajon, Calif.; William L. Rea, San Diego, Calif.

[73] Assignee: The United States of America as represented by the Secretary of the Navy, Washington, D.C.

[22] Filed: May 12, 1975

[21] Appl. No.: 576,941

[52] U.S. Cl. .................. 72/416; 29/34 B; 72/462; 72/470; 408/90
[51] Int. Cl.² .................................. B21J 13/02
[58] Field of Search ............ 72/416, 470, 462, 391; 408/90; 29/26 R, 26 A, 34 B, 564, 522, 523, 243.53, 243.54; 227/52, 60

[56] References Cited
UNITED STATES PATENTS

| | | | |
|---|---|---|---|
| 373,891 | 11/1887 | Hall | 72/416 |
| 1,833,268 | 11/1931 | Spry | 227/52 |
| 1,984,350 | 12/1934 | Halsey | 29/523 |
| 2,795,039 | 6/1957 | Hutchins | 29/523 |
| 3,432,925 | 3/1969 | Woolley | 29/522 |
| 3,446,908 | 5/1969 | Tally | 29/522 |
| 3,484,935 | 12/1969 | Burns | 29/522 |
| 3,484,937 | 12/1969 | Campbell | 29/630 R |

*Primary Examiner*—C. W. Lanham
*Assistant Examiner*—Gene P. Crosby
*Attorney, Agent, or Firm*—R. S. Sciascia; G. J. Rubens

[57] ABSTRACT

A conventional drill press is provided with an eyeletting attachment to enable connector-type eyelets to be mounted in an electronic circuit board. The eyeletting attachment includes a pair of readily attachable tool holders; a movable upper holder attachable to the drill press quill, and a fixed lower tool holder attachable to the drill press stand, between which the workpiece is positioned and worked.

7 Claims, 4 Drawing Figures

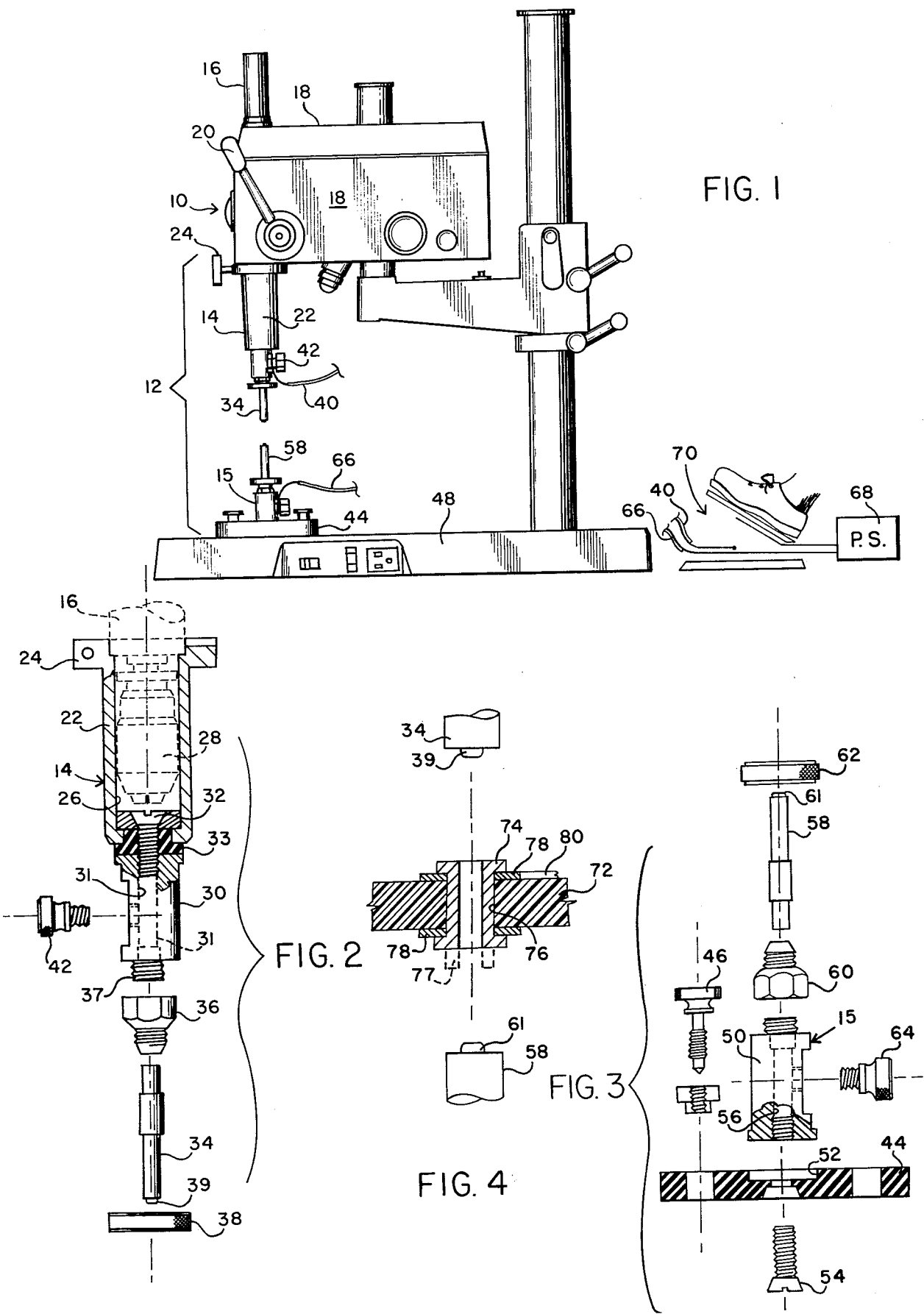

EYELETTING ATTACHMENT FOR DRILL PRESSES

BACKGROUND OF THE INVENTION

This invention relates to metal working tools, designed primarily for ready attachment to a conventional drill press, but it is to be understood that it can be used for any purposes for which it is found applicable.

In the manufacture of electrical circuit boards, it is a standard practice to attach connectors, i.e., eyelets, through the board that provide the means for electrically connecting the components mounted on one or both sides of the board.

Apparatus for attaching the eyelets to the circuit boards is available, in the form of arbor presses, but such machines are of special design, large, and relatively costly, and being a special purpose tool, can be used only for this specific purpose.

Accordingly, such machines are not suitable or practical for use at advanced military bases, on board naval repair ships, or at simple repair facilities not having an extensive use for such machines.

SUMMARY OF THE INVENTION

A simple, inexpensive attachment is provided for a conventional drill press to enable the attaching of eyelets to electrical circuit boards. The novel eyeletting attachment comprises complementary tool holders attachable to regular components of the conventional drill press. An upper tool holder is detachably clamped to the vertically movable drill quill, and a lower tool holder is bolted or otherwise attached to the drill press base. The circuit board is positioned between the tools, and with the blank eyelet in position, the quill is manually lowered to accomplish the peening task. The tool holders are electrically connected to a power source to provide an eyeletting fusing capability, if desired.

STATEMENT OF THE OBJECTS OF THE INVENTION

A principal object of this invention is to provide an eyeletting attachment that readily can be detachably mounted to a conventional drill press, so that the drill press, in addition to its normal drilling operations, also may be utilized for securing connector-type eyelets to an electronic circuit board.

A corollary object is to provide such an attachment that requires practically no structural modification to the drill press so that the drill press can be interchangeably used for eyeletting attachments or for its conventional drilling uses.

Still another important object is to provide such an attachment that will enable the drill press to accomplish both cold set eyeletting and hot set eyeletting.

Other objects, advantages and novel features of the invention will become apparent from the following detailed description of the invention when considered in conjunction with the accompanying drawings.

BRIEF DESCRIPTION OF THE DRAWINGS

FIG. 1 is a side elevation of a conventional bench-type drill press on which is detachably mounted the novel eyeletting attachment of this invention.

FIGS. 2 and 3 are exploded, side elevation views partially in section of the upper and lower tool holder assemblies, respectively.

FIG. 4 is an enlarged cross-sectional view of a typical electrical circuit board showing a connector-type eyelet inserted therein before and after the novel drill press attachment has been utilized to secure the eyelet therein.

DESCRIPTION OF THE PREFERRED EMBODIMENT

Referring to the drawing where like reference numerals refer to similar parts throughout the figures, there is shown in FIG. 1 a conventional drill press 10 having detachably mounted thereon the novel eyeletting attachment 12 of this invention. Drill press 10 may be a miniature, high-speed precision bench model, manufactured by the Servo Corporation.

Eyeletting attachment 12 consists of a complementary pair of tool holder assemblies, an upper movable tool holder assembly 14, and a lower fixed tool holder assembly 15 for securing an eyelet in an electrical circuit board, as illustrated in FIG. 4.

Upper tool assembly 14 is detachably mounted to drill press quill 16 vertically movable in drill press head 18 by means of a quill handle 20. Upper tool assembly 14, shown exploded in FIG. 2, comprises a sleeve 22 having at the upper flanged end an integral clamp 24 for securing the sleeve to the lower end of quill 16. Sleeve bore 26 provides a housing to accommodate the conventional drill press chuck 28, shown in broken lines in FIG. 2, avoiding the necessity for removing the chuck in order to utilize the drill press for the eyeletting operation.

A metal tool support 30, having a longitudinally drilled opening 31, is bolted at 32 to the lower end of sleeve 22 through an electrical insulating washer 33. A rod-shaped tool 34 is mounted to support 30 through an adjustable collet 36 threaded on a nipple 37 screwed in opening 31, the collet being tightened by clamp 38. The free end of tool 34 terminates in a small nipple 39 for alignment and engaging the eyelet. An electrical conductor 40, for a purpose later to be described, is detachably connected to tool support 30 by a thumb screw 42 transversely threaded therein.

Lower tool assembly 15 has a mounting plate 44 made of insulation material, i.e., phenolic plastic, and by means of a pair of bolts 46, is detachably secured to the drill press bed 48 in a position directly aligned under upper tool assembly 14. A tool support 50, similar to 30, is seated at one end in a recess 52 in plate 44 and is secured therein by a bolt 54 threaded in the lower end of a longitudinally drilled hole 56 extending entirely through the support. A rod-shaped tool 58, being a couterpart of tool 34, is also secured to tool support 50 at a predetermined selected position by a collet 60 and a collet clamp 62. A nipple 61 is also provided on the free end of tool 58. Knurled bolt 64 is threadedly mounted into the side of tool support 50 for providing electrical contact for conductor 66.

Conductors 40 and 66 electrically connect the respective tool holders 34 and 58, respectively, to an electrical power source 68 through a foot operated switch 70. This circuit enables the application of heat to tools 34 and 58 should it be desired to fuse the eyelets on the board.

There is shown in FIG. 4 a cross-section of a typical electrical circuit board 72 in which is to be mounted an eyelet-type connector 74 inserted into an opening 76 therein. The condition of the lower end of eyelet 74 before the peening operation is shown in broken lines at 77. Pads 78 are provided under the eyelet for connection to a conductor run 80.

In operation, eyelet connector 74 is inserted into opening 76 in the board and with pads 78 in position, the assembly is positioned on the lower tool assembly 15 with the eyelet centered on tool 58 and its nipple 61. With the eyelet 74 thus aligned, the quill handle is actuated to lower the upper tool assembly 14, with tool 34 and its nipple 39 engaging the upper end of the eyelet and peening over the lower end of the eyelet from its original position 77 to the solid line position snugly engaging the lower pad 78 to complete the eyeletting operation.

The eyeletting attachment of this invention provides a means whereby a conventional drill press can also be used to attach eyelets to a circuit board in a simple and expedient manner, eliminating the need for the purchase of special equipment and the space necessary to stow an additional piece of equipment.

Obviously many modifications and variations of the present invention are possible in the light of the above teachings. It is therefore to be understood that within the scope of the appended claims the invention may be practiced otherwise than as specifically described.

What is claimed is:

1. An eyeletting attachment for a conventional drill press having a horizontal base, a column, a vertically adjustable head supported on said column, and a manually actuated, vertically movable quill mounted in said head, the attachment comprising:
    upper and lower tool holder assemblies;
    said upper tool holder assembly having means for detachably securing to the lower end of said quill;
    means on said upper tool holder assembly for vertically supporting one of a pair of ram eyeletting tools;
    said lower tool holder assembly comprising a base member having means for anchoring to the base of said drill press in a vertically aligned position with the upper tool holder assembly;
    means mounted on said base member for vertically supporting the other ram eyeletting tool of said pair of tools;
    whereby the quill of the drill press may be manually lowered to peen an eyelet to its supporting plate between the ends of the eyeletting ram tools.

2. The eyeletting attachment of claim 1 wherein said tools are provided with nipples on their free ends to align the respective tools with the eyelet.

3. The eyeletting attachment of claim 1 wherein said ram tools are detachably secured to their respective tool holder assembly to permit replacement.

4. The eyeletting attachment of claim 1 wherein said ram tools are electrically connected to a power source for hot setting the eyelet during the peening operation.

5. The eyeletting attachment of claim 4 wherein a foot pedal switch is electrically connected between the tools and the power source.

6. The eyeletting attachment of claim 1 wherein said means for securing the upper tool assembly includes a hollow sleeve capable of housing a drill press chuck that may be suspended from the quill.

7. The eyeletting attachment of claim 6 wherein one end of said sleeve has an internal shoulder to receive the end of the quill, and clamping means are provided for securing the sleeve to the end of the quill.

* * * * *